US006242299B1

(12) United States Patent
Hickert

(10) Patent No.: US 6,242,299 B1
(45) Date of Patent: Jun. 5, 2001

(54) BARRIER LAYER TO PROTECT A FERROELECTRIC CAPACITOR AFTER CONTACT HAS BEEN MADE TO THE CAPACITOR ELECTRODE

(75) Inventor: George Hickert, Colorado Springs, CO (US)

(73) Assignee: Ramtron International Corporation, Colorado Springs, CO (US)

(*) Notice: Subject to any disclaimer, the term of this patent is extended or adjusted under 35 U.S.C. 154(b) by 0 days.

(21) Appl. No.: 09/283,166

(22) Filed: Apr. 1, 1999

(51) Int. Cl.$^7$ ................................................ H01L 21/8242

(52) U.S. Cl. ........................ 438/240; 438/3; 438/253; 438/643; 438/785

(58) Field of Search ................................ 438/240, 244, 438/250, 253, 239, 3, 785, 254–256, 396–399, 642, 643

(56) References Cited

U.S. PATENT DOCUMENTS

| | | |
|---|---|---|
| 3,184,660 | 5/1965 | Robinson . |
| 3,569,802 | 3/1971 | Braver et al. . |
| 3,579,063 | 5/1971 | Wasa et al. . |
| 3,819,990 | 6/1974 | Hayashi et al. . |
| 4,141,022 | 2/1979 | Sigg et al. . |
| 4,149,301 | 4/1979 | Cook . |
| 4,149,302 | 4/1979 | Cook . |
| 4,636,908 | 1/1987 | Yoshihara et al. . |
| 4,675,715 | 6/1987 | Lepselter et al. . |
| 4,700,457 | 10/1987 | Matsukawa . |
| 4,707,897 | 11/1987 | Roher et al. . |
| 4,757,028 | 7/1988 | Kondoh et al. . |
| 4,759,823 | 7/1988 | Asselamis et al. . |
| 4,809,225 | 2/1989 | Dimmier et al. . |
| 4,811,078 | 3/1989 | Tigelaar et al. . |
| 4,851,895 | 7/1989 | Green et al. . |
| 4,853,893 | 8/1989 | Eaton, Jr. et al. . |
| 4,860,257 | 8/1989 | Pott et al. . |

(List continued on next page.)

OTHER PUBLICATIONS

S.F. Vogel and I.C. Barlow, *Sputtered Plantinum as Substrate for Ferroelectric Film Deposition*. J. Vac.Sci. Technol., vol. 10, No. 5, Sep./Oct. 1973.

J. Scott, "Ferroelectric Memory Applications", IEEE 1989 Ultrasonics Symposium (Oct. 3, 1989).

Chin–An Chang, *Deposition of (100) Au., Ag, Pt, Pb and Fe on (100) Si Using Differential Metal Seed Layers*, J. Vac., Sci. Technol. A, vol. 9, No. 1, Jan./Feb. 1991.

J. Kudo, et al., "A High Stability Electrode Technology for Stacked $SrBi_2Ta_2O_9$ Capacitors Applicable to Advanced Ferroelectric Memory", *IEEE*, pp. 25.4, 1–25.4.4, 1997.

Chapman, S.P., et al, "Tuning PZT DO Fabrication Processes by Optimizing Imprint", abstract, Ninth International Symposium on Integrated Ferroelectrics, Santa Fe, New Mexico, Mar. 3, 1997.

Kim, D., et al, "Effects of Substrate Modification on the Growth and Characteristics of MOCVD PZT", pp. 67–79, Ninth International Symposium on Integrated Ferroelectrics, Santa Fe, New Mexico, Mar. 3, 1997.

*Primary Examiner*—Charles Bowers
*Assistant Examiner*—Yennhu Huynh
(74) *Attorney, Agent, or Firm*—Peter J. Meza, Esq.; Carol W. Burton, Esq.

(57) ABSTRACT

A continuous barrier layer is formed after a local interconnect metal layer is formed between the top electrode of a ferroelectric capacitor and the source/drain contact of a memory cell transistor in an integrated ferroelectric memory. After contact has been made to the top electrode of the ferroelectric capacitor, a thin dielectric layer is deposited using a material that provides an effective hydrogen barrier to the ferroelectric capacitor. The barrier layer minimizes damage to the ferroelectric capacitor and thus improves electrical performance.

20 Claims, 8 Drawing Sheets

U.S. PATENT DOCUMENTS

| | | |
|---|---|---|
| 4,888,733 | 12/1989 | Mobley . |
| 4,893,272 | 1/1990 | Eaton, Jr. et al. . |
| 4,910,708 | 3/1990 | Eaton, Jr. et al. . |
| 4,914,627 | 4/1990 | Eaton, Jr. et al. . |
| 4,918,654 | 4/1990 | Eaton, Jr. et al. . |
| 4,982,309 | 1/1991 | Shepherd . |
| 5,003,428 | 3/1991 | Shepherd . |
| 5,005,102 | 4/1991 | Larson . |
| 5,024,964 | 6/1991 | Roher et al. . |
| 5,031,144 | 7/1991 | Persky . |
| 5,036,382 | 7/1991 | Yamaha . |
| 5,040,046 | 8/1991 | Chhabra et al. . |
| 5,043,049 | 8/1991 | Takenaka . |
| 5,099,305 | 3/1992 | Takenaka . |
| 5,119,154 | 6/1992 | Gnadinger . |
| 5,122,477 | 6/1992 | Wolters et al. . |
| 5,124,014 | 6/1992 | Foo et al. . |
| 5,142,437 | 8/1992 | Kammerdiner et al. . |
| 5,146,299 | 9/1992 | Lampe et al. . |
| 5,155,573 | 10/1992 | Abe et al. . |
| 5,170,242 | 12/1992 | Stevens et al. . |
| 5,191,510 | 3/1993 | Huffman . |
| 5,192,704 | 3/1993 | McDavid et al. . |
| 5,212,620 | 5/1993 | Evans, Jr. et al. . |
| 5,216,572 | 6/1993 | Larson et al. . |
| 5,229,309 | 7/1993 | Kato . |
| 5,231,058 | 7/1993 | Maeda et al. . |
| 5,266,355 | 11/1993 | Wernberg et al. . |
| 5,273,927 | 12/1993 | Gnadinger . |
| 5,286,681 | 2/1994 | Maeda . |
| 5,293,075 | 3/1994 | Onishi et al. . |
| 5,293,510 | 3/1994 | Takenaka . |
| 5,303,186 | 4/1994 | Yamauchi . |
| 5,335,138 | 8/1994 | Sandhu et al. . |
| 5,350,705 | 9/1994 | Brassington et al. . |
| 5,371,700 | 12/1994 | Hamada . |
| 5,375,085 | 12/1994 | Gnade et al. . |
| 5,381,364 | 1/1995 | Chern et al. . |
| 5,382,817 | 1/1995 | Kashihara et al. . |
| 5,383,150 | 1/1995 | Nakamura et al. . |
| 5,390,143 | 2/1995 | Manning . |
| 5,396,095 | 3/1995 | Wolters et al. . |
| 5,416,735 | 5/1995 | Onishi et al. . |
| 5,438,023 | 8/1995 | Argos et al. . |
| 5,440,173 | 8/1995 | Evans, Jr. et al. . |
| 5,475,248 | 12/1995 | Takenaka . |
| 5,481,490 | 1/1996 | Wantanabe et al. . |
| 5,523,595 | 6/1996 | Takenaka et al. . |
| 5,525,528 | 6/1996 | Perino et al. . |
| 5,530,668 | 6/1996 | Chern et al. . |
| 5,532,953 | 7/1996 | Ruesch et al. . |
| 5,536,672 | 7/1996 | Miller et al. . |
| 5,554,559 | 9/1996 | Wolters et al. . |
| 5,559,052 | 9/1996 | Lee et al. . |
| 5,578,867 | 11/1996 | Argos, Jr. et al. . |
| 5,638,319 | 6/1997 | Onishi et al. . |
| 5,679,969 | 10/1997 | Evans, Jr. et al. . |
| 5,716,875 | 2/1998 | Jones, Jr. et al. . |
| 5,864,932 | 2/1999 | Evans et al. . |
| 5,866,926 | 2/1999 | Takenaka . |
| 5,902,131 | * 5/1999 | Argos et al. ............... 438/240 |

* cited by examiner

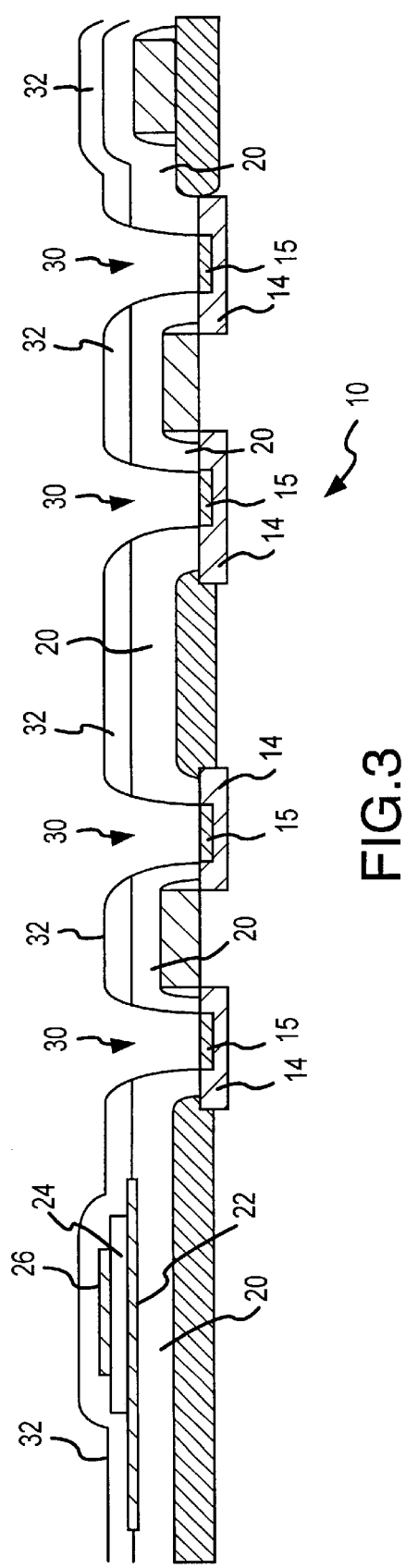
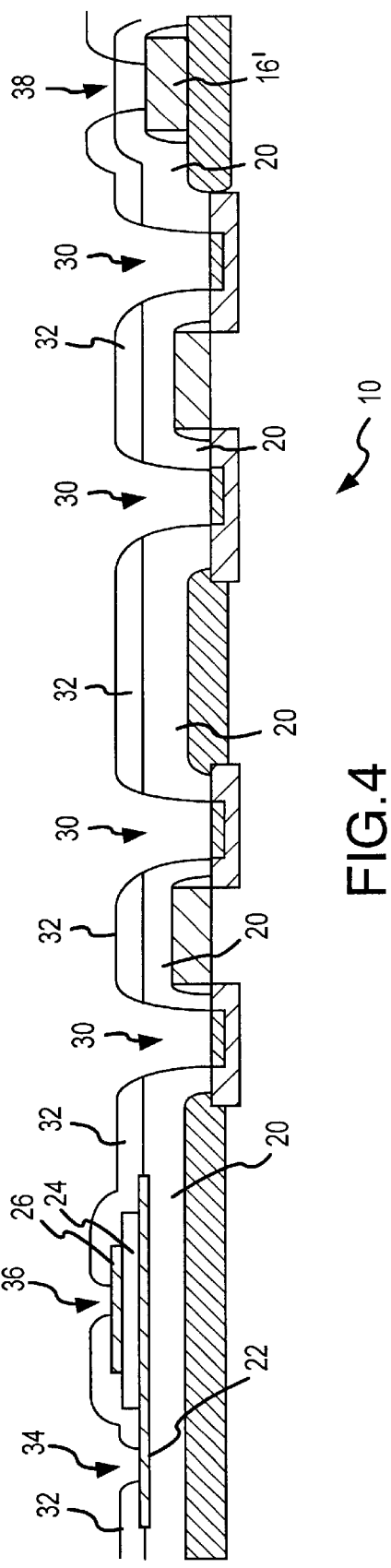
FIG.3
FIG.4

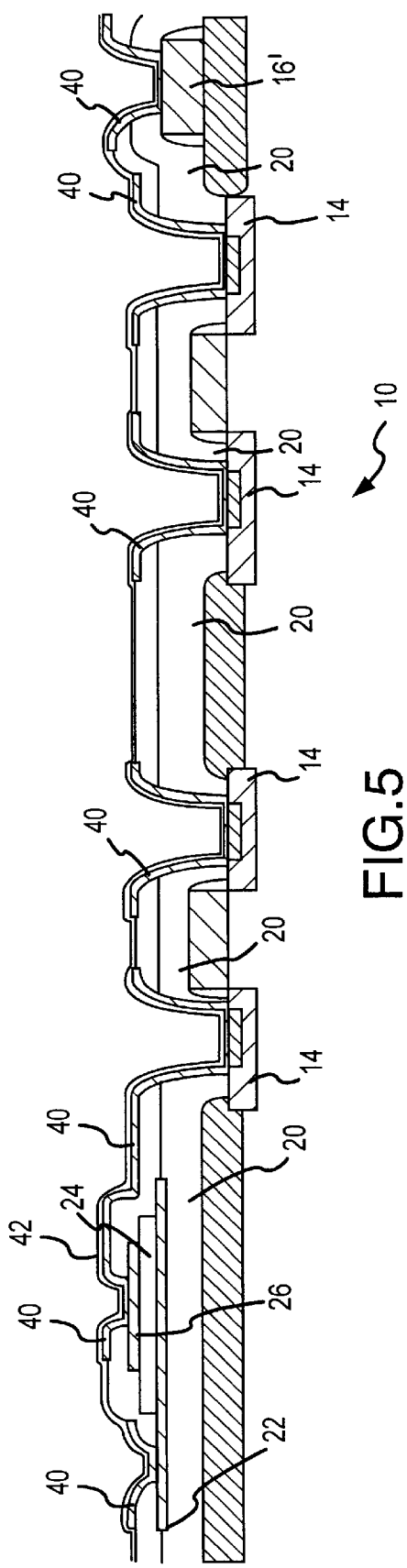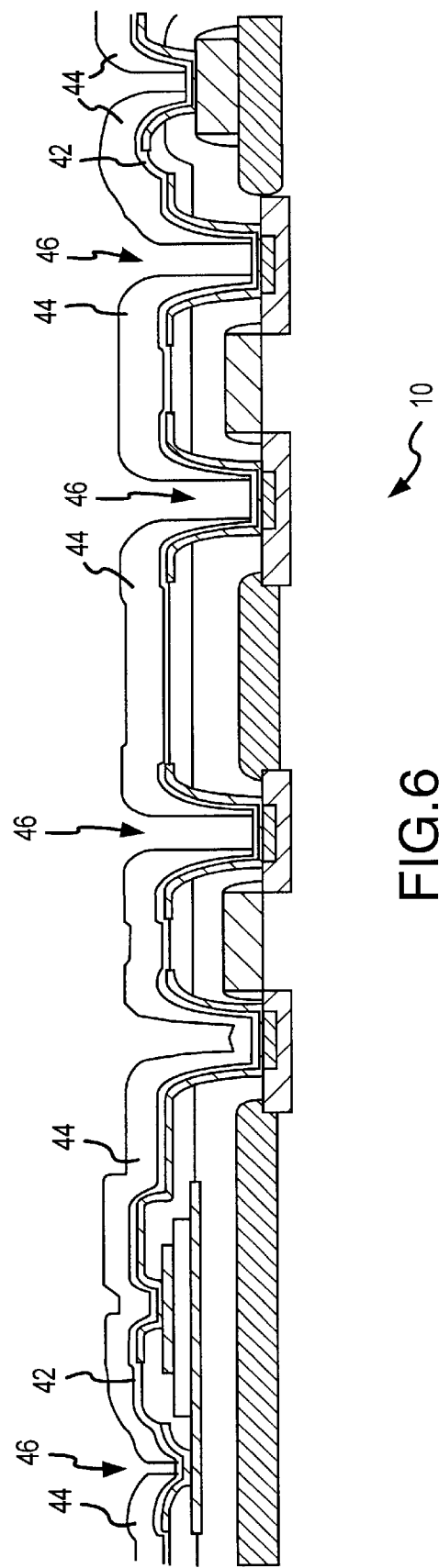

BARRIER LAYER TO PROTECT A FERROELECTRIC CAPACITOR AFTER CONTACT HAS BEEN MADE TO THE CAPACITOR ELECTRODE

BACKGROUND OF THE INVENTION

This invention relates generally to ferroelectric memories and ferroelectric capacitors. More particularly, the present invention relates to the protection of ferroelectric capacitors and memories from damage incurred during processing.

Ferroelectric films are used as the storage element in non-volatile memory circuits. A quantity of charge is liberated when the film is poled by an externally applied electric field. The quantity of this "switched charge" is crucial when fabricating a robust, reliable integrated circuit ferroelectric memory. If the amount of switched charge is reduced below a threshold level, the data state corresponding to the liberated charge quantity cannot be reliably ascertained.

Ferroelectric films are typically manufactured from lead perovskite-based materials such as PZT (lead zirconate titanate). The desirable electrical performance characteristics of PZT can be damaged by exposure to hydrogen either during integrated circuit processing steps or during subsequent packaging steps. Hydrogen can be produced from the breakdown of excess water in oxide layers, or by outgassing of packaging materials, as well as from countless other sources found during integrated circuit processing and packaging.

One technique for minimizing hydrogen exposure is by using a perovskite-based passivation layer as a "getter" layer for absorbing hydrogen. One problem with perovskite-based passivation layers is that there may be an undesirable interaction between aluminum wiring layers and the passivation layer. Multiple layer passivation layers and non-perovskite passivation layers have also been used to try to minimize hydrogen exposure without causing an undesirable chemical reaction with the aluminum wiring layers. In general, all passivation layers serve to mainly protect the ferroelectric integrated circuit from exposure to hydrogen during packaging. Also, a passivation layer effective in stopping packaging-related hydrogen may cause additional damage to the ferroelectric layer by trapping moisture stored in integrated circuit oxide layers.

Another technique for minimizing hydrogen exposure is by using an "encapsulation layer" wherein the top electrode of the ferroelectric capacitor is covered completely with a PZT or other perovskite-based layer, or by some other layer capable of absorbing hydrogen. While the encapsulation technique is widely believed to be extremely effective in reducing the amount of hydrogen exposure to the ferroelectric film, it can be greatly compromised by the top electrode contact that is etched into the encapsulation layer to provide electrical access to the top electrode.

What is desired, therefore, is an easily manufacturable solution for minimizing hydrogen exposure and related loss of performance during both integrated circuit processing and packaging of an integrated circuit ferroelectric memory.

SUMMARY OF THE INVENTION

It is, therefore, a principal object of the present invention to provide an uninterrupted barrier layer to protect a ferroelectric capacitor from damage and degradation during subsequent wafer processing, assembly processing, and use conditions.

It is an advantage of the invention that it allows the use of a single barrier layer.

It is another advantage of the invention that it allows full recovery of the ferroelectric capacitor, which may be difficult with prior art techniques such as barrier passivation.

It is another advantage of the invention that it avoids the loss of barrier integrity resulting from contact cuts through the barrier layer, as is the case with prior art barriers formed directly on the capacitor stack.

It is still another advantage of the present invention that it allows the use of processing techniques that would otherwise be harmful to the performance of the integrated circuit ferroelectric capacitors such as hot aluminum reflow plug fill, MLM (multi-level metal), CVDW (chemical vapor deposition tungsten) plugs, as well as silicon nitride passivation and ILD (interlevel dielectric) processes.

According to the present invention a continuous barrier layer is formed after the local interconnect layer is formed between the top electrode of a ferroelectric capacitor and the source/drain contact of a memory cell transistor in an integrated circuit ferroelectric memory. After contact has been made to the top electrode of the ferroelectric capacitor, a thin dielectric layer is deposited that provides a hydrogen barrier to the ferroelectric capacitor. The continuous barrier layer allows direct contact to the capacitor eliminating the need to offset the contact from the capacitor stack.

The process flow of the present invention uses a subsequent interlevel dielectric layer as a hard mask when patterning contacts through the barrier layer. This allows the flexibility to use a variety of barriers that are non-reactive and not easily etched using standard contact oxide etches, including but not limited to silicon nitride, aluminum oxide, titanium oxide, PZT, PLZT, SBT, BST, or high density silicon dioxide.

The use of an interlevel oxide layer as a hard mask to etch the barrier layer has additional benefits beyond flexibility in the choice of barrier layer material. The oxide layer hard mask reduces formation of polymer residues in the contact that may be present with other etching techniques, thus improving the integrity of subsequent metal interconnect. The use of the oxide layer as a hard mask also results in the corners and thickest areas of the oxide layer being etched without significant thinning of the minimum coverage areas, thus improving step coverage and ease of deposition of subsequent interconnects.

The inclusion of a sole barrier layer after local interconnect formation results in more flexibility during post-local interconnect processing including the use of multilevel metal and silicon nitride passivation, fewer restrictions on assembly procedures including choice of package type and assembly materials, and a more reliable finished product. The process flow of the present invention includes a method for subsequent contact cuts through the barrier layer that allows the use of barrier layers that are not easily etched using standard oxide etches. Inclusion of the sole barrier layer according to the present invention provides a sufficient barrier to hydrogen so that a memory cell structure can be constructed with or without a separate barrier layer directly on top of the capacitor stack.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIGS. 1–9 are cross-sectional views of a preferred fabrication method according to the present invention wherein:

FIG. 1 is a cross-sectional view of a portion of an integrated circuit ferroelectric memory showing a silicon or other substrate, two CMOS transistors, a bottom electrode layer, a PZT ferroelectric layer, and a top electrode layer;

FIG. 2 is a cross-sectional view of the same portion of the integrated circuit ferroelectric memory in which the bottom electrode, PZT, and top electrode layers are etched to form a ferroelectric capacitor stack;

FIG. 3 is a cross-sectional view of the same portion of the integrated circuit ferroelectric memory further including an etched oxide layer;

FIG. 4 is a cross-sectional view of the same portion of the integrated circuit ferroelectric memory showing subsequent etching of the oxide layer;

FIG. 5 is a cross-sectional view of the same portion of the integrated circuit ferroelectric memory showing top and bottom electrode metalization including a local interconnect strap, and a continuous barrier layer according to the present invention;

FIG. 6 is a cross-sectional view of the same portion of the integrated circuit ferroelectric memory showing an additional oxide layer deposited over the barrier layer and etched;

FIG. 7 is a cross-sectional view of the same portion of the integrated circuit ferroelectric memory in which the barrier layer is etched;

FIG. 8 is a cross-sectional view of the same portion of the integrated circuit ferroelectric memory further including an etched aluminum metalization layer;

FIG. 9 is a cross-sectional view of the same portion of the integrated circuit ferroelectric memory further including a passivation layer;

FIGS. 10–13 are cross-sectional views of a second fabrication method for a high density planar process according to the present invention wherein:

FIG. 10 is a cross-sectional view of a portion of an integrated circuit ferroelectric memory showing a silicon or other substrate, a CMOS underlayer including a first planarized dielectric layer, conducting plugs, and a second planarized dielectric layer;

FIG. 11 is a cross-sectional view of the same portion of the integrated circuit ferroelectric memory further including a ferroelectric capacitor stack and a third dielectric layer;

FIG. 12 is a cross-sectional view of the same portion of the integrated circuit ferroelectric memory further including an etched local interconnect layer and a continuous barrier layer; and FIG. 13 is a cross-sectional view of the same portion of the integrated circuit ferroelectric memory further including additional planarized dielectric layers, as well as metalization layers.

DETAILED DESCRIPTION

Figure 1:
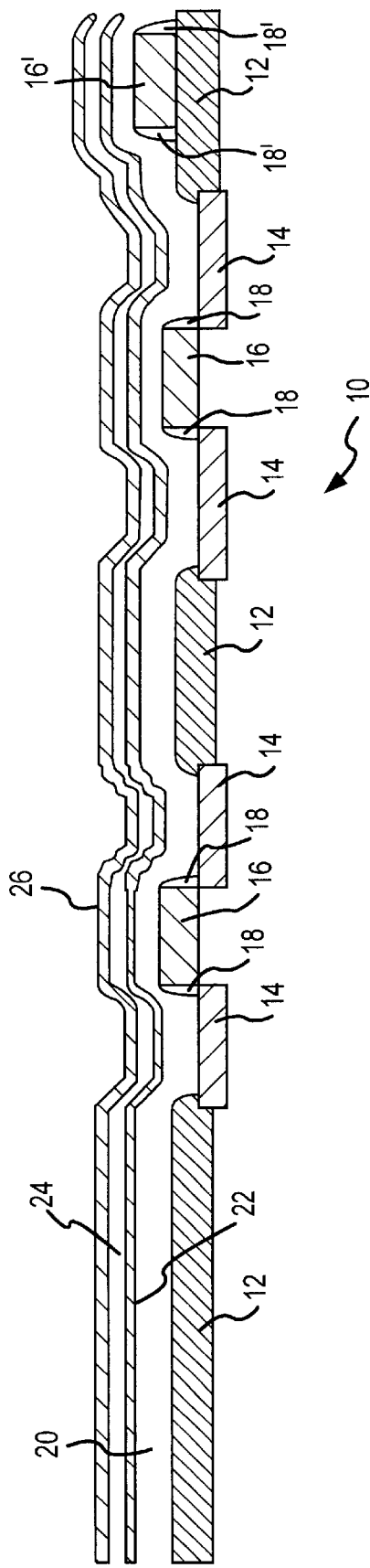

Referring now to FIG. 1, a portion of an integrated circuit ferroelectric memory includes a silicon or other substrate 10, thick field oxide layer 12, source/drain transistor contacts 14, also referred to herein as source/drain regions 14 and as source/drains 14, polysilicon gate 16, and sidewall spacers 18. Source/drains 14 and polysilicon gates 16 form two transistors isolated by the thick field oxide 12. An additional polysilicon gate 16' represents the extension of the polysilicon gate 16 onto the thick field oxide 12 where contact is made. Polysilicon gate 16' is also surrounded by sidewall spacers 18'. A conformal layer 20 of BPSG ("boron phosphorous-doped silicon glass") is formed over the surface of the partially fabricated ferroelectric memory to a thickness of about 3000 Angstroms.

A dehydration bake consisting of a bake at about 900 degrees Celsius for about a half of an hour in a nitrogen atmosphere is then performed to de-gas the BPSG layer 20 and to anneal the active implants in source/drains 14.

A bottom electrode layer 22 including a first titanium layer about 200 Angstroms thick and a platinum layer about 1750 Angstroms thick is then eposited. A PZT (lead zirconate titanate), PLZT (lanthanum-doped lead irconate titanate), BST (barium strontium titanate), SBT (strontium bismuth titanate), SBTN (strontium bismuth titanate niobate), or other ferroelectric layer is subsequently deposited to a thickness of about 2200 Angstroms.

After the PZT layer 24 is deposited, a first anneal is performed. Preferably, this is an RTA (Rapid Thermal Anneal) consisting of a baking step at about 600 degrees Celsius for about ninety seconds in an argon atmosphere. A second step includes a baking step at about 725 degrees Celsius for about twenty seconds in an oxygen atmosphere. The first anneal is further described in co-pending application Ser. No. 09/064,465, entitled "Multi-layer Approach for Optimizing Ferroelectric Film Performance", filed on Apr. 22, 1998, and assigned to the assignee of the present application, and which is hereby incorporated by this reference.

Finally in FIG. 1, a platinum top electrode layer 26 is sputter deposited to a thickness of about 1750 Angstroms. The bottom and top electrode layers 22 and 26 can also be formed of other metals or conductive oxides such as iridium or iridium oxide, if desired.

Figure 2:
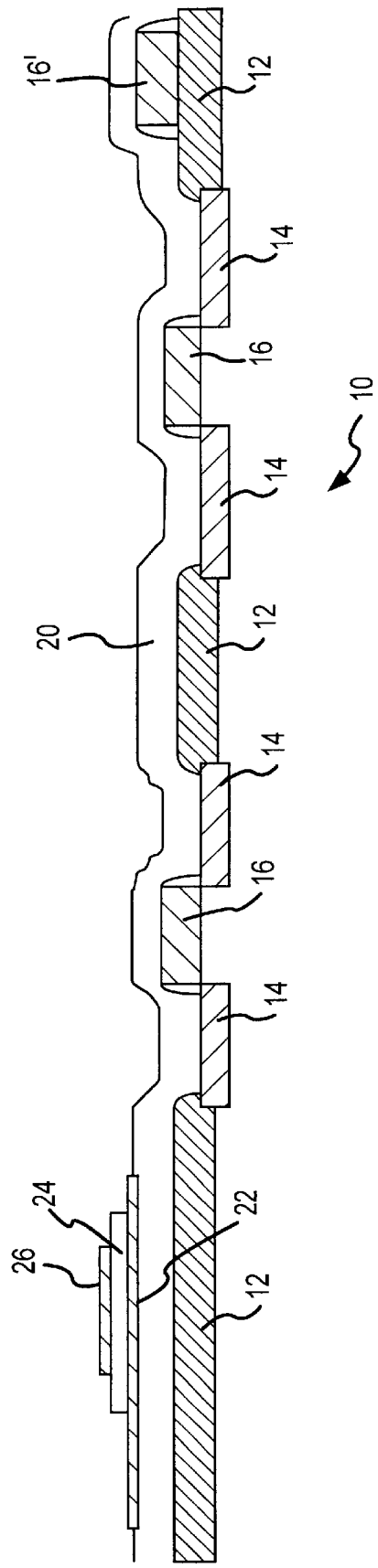

Referring now to FIG. 2, a ferroelectric capacitor stack is formed including a patterned and etched bottom electrode layer 22, a patterned and etched PZT layer 24, and a patterned and etched top electrode layer 26. The top electrode layer is initially patterned and etched using a high density plasma etch.

A second annealing step is then performed that consists of a baking step at about 650 degrees Celsius for about one hour in an oxygen atmosphere.

The PZT layer 24 is then subsequently patterned and etched using a high density plasma etch.

The bottom electrode layer 22 is then subsequently patterned and etched using a high density plasma etch.

A first recovery anneal is then performed, which consists of a furnace baking step at about 550 degrees Celsius for about one hour in an oxygen atmosphere.

Referring to FIG. 3, an "FFO" (Ferroelectric Oxide Deposition) oxide layer 32 is deposited over the entire surface of the partially formed ferroelectric memory. Oxide layer 32 is typically phosphorous-doped TEOS oxide and is deposited to a thickness of about 3000 Angstroms. Vias 30 are etched into oxide layer 32 and oxide layer 20 using an isotropic plasma etch to expose the source/drain contacts 14. Platinum is deposited over the entire surface of the memory and the wafer is annealed using a rapid thermal anneal at a temperature of about 450 degrees Celsius for about fifteen seconds in an oxygen atmosphere. This forms platinum silicide regions 15 in the source/drain regions 14, wherever the silicon has been exposed to platinum. The unreacted platinum is etched from the oxide layers using Aqua Regia.

Referring to FIG. 4, additional vias 34 and 36 are etched into oxide layer 32 using an isotropic plasma etch, for creating contacts to the bottom electrode 22 and top electrode 26. Following this contact etching step, the device receives an oxygen anneal to recover damage to the ferroelectric capacitor and to densify oxide layer 32 by removing hydrogen and moisture. Via 38 is etched into oxide layers 32 and 20 using a wet/dry etch, for creating a contact to the polysilicon gate 16'.

Referring to FIG. 5, a local interconnect layer 40 formed of titanium nitride is deposited to a thickness of between 500 and 1500 Angstroms, but preferably to a thickness of about 800 Angstroms to connect the capacitor top electrode 26 to one of the source/drains 14. Local interconnect layer 40 is also used to metalize the bottom electrode 22, remaining source/drains 14, and polysilicon gate 16', and to provide an etch stop for later contacts to be etched through the barrier layer as described below. The local interconnect layer 40 is patterned and etched using a reactive ion etch.

A continuous blanket barrier layer 42 is then deposited on the surface of the partially formed memory including the local interconnect layer 40, after it is patterned as is shown in FIG. 5. The barrier layer 42 is a layer of hydrogen absorbent material of sufficient thickness to protect ferroelectric layer 24 by substantially blocking the flow of hydrogen to the ferroelectric layer 24. The blanket barrier layer 42 can be formed of silicon nitride, aluminum oxide, titanium oxide, PZT, PLZT, SBT, SBTN, BST, or high density silicon dioxide. The barrier layer 42 is deposited to a thickness of between 200 Angstroms and 1200 Angstroms, except if aluminum oxide is used for the barrier layer, in which case a range of thickness between 500 and 1000 Angstroms is preferred. Thinner and thicker barrier layers can be used, but thinner layers may compromise the ability to block hydrogen degradation of ferroelectric layer 24, and thicker layers may be harder to etch and may result in increased step heights, thus increasing the costs of the manufacturing process.

In FIG. 6, a local interconnect oxide layer 44 is deposited, using silicon dioxide or TEOS deposited to a thickness of about 3500 Angstroms. After ILD deposition (ILD=interlevel dielectric or layer 44), the device is coated with resist and patterned using standard photolithography methods. The $SiO_2$ in the contacts is etched using a standard anisotropic oxide etch, stopping on the barrier layer 42, followed by a clean to remove the photoresist. Thus, recut contacts 46 are etched into oxide layer 44, using the barrier layer 42 as an etch stop.

Figure 7:
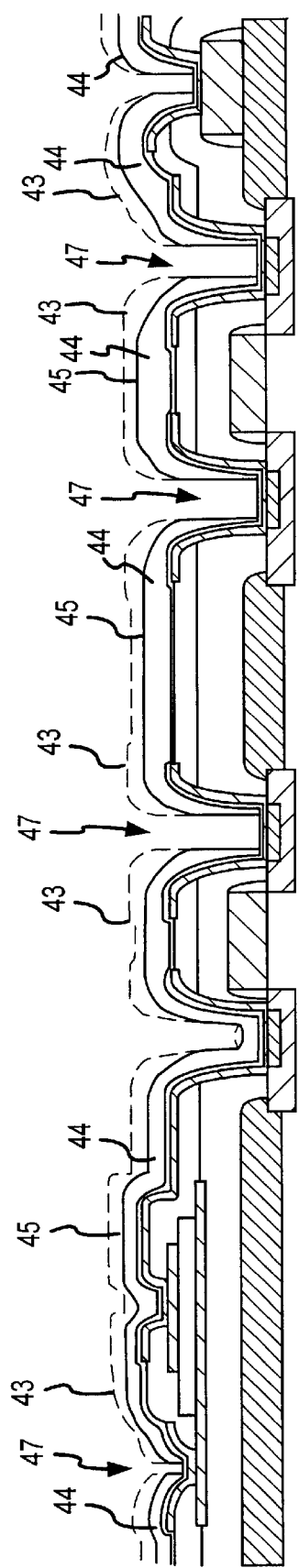

In FIG. 7, subsequent contact cuts 47 are made to provide contact through the barrier layer 42 (to local interconnect layer 40 on source/drains 14, on polysilicon gate 16', or on the bottom electrode 22). The barrier layer 42 is then blanket etched using a highly physical high density plasma etch with little selectivity to the $SiO_2$ layer 44, using the $SiO_2$ layer 44 itself as a hard mask. The original surface 43 and post-etched surface 45 of layer 44 can also be seen in FIG. 7.

This method of the present invention thus has several advantages. There is more flexibility in the material choice for barrier layer 42 because many of the prior art etch considerations are eliminated. Removal of the resist prior to the barrier etch reduces the formation of polymer residues in the contact improving the integrity of subsequent interconnect. The use of the $SiO_2$ as a hard mask results in the corners and thickest areas of the $SiO_2$ being etched without significant thinning of the minimum coverage areas. This improves step coverage and eases the deposition of subsequent interconnects.

Figure 8:
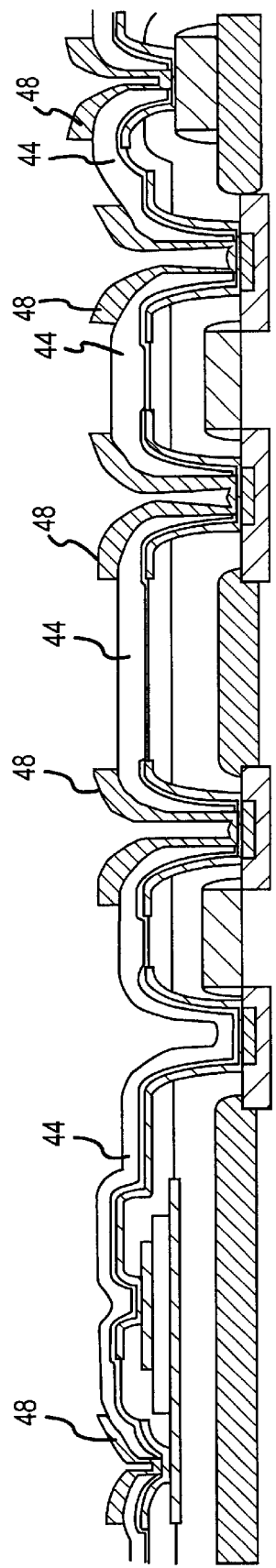

In FIG. 8, the contacts are metalized using metal layer 48. Metal layer 48 includes a TiN barrier layer portion about 1500 Angstroms thick and a aluminum-copper portion about 8000 Angstroms thick. The metal layer 48 is etched using a reactive ion etch.

Figure 9:
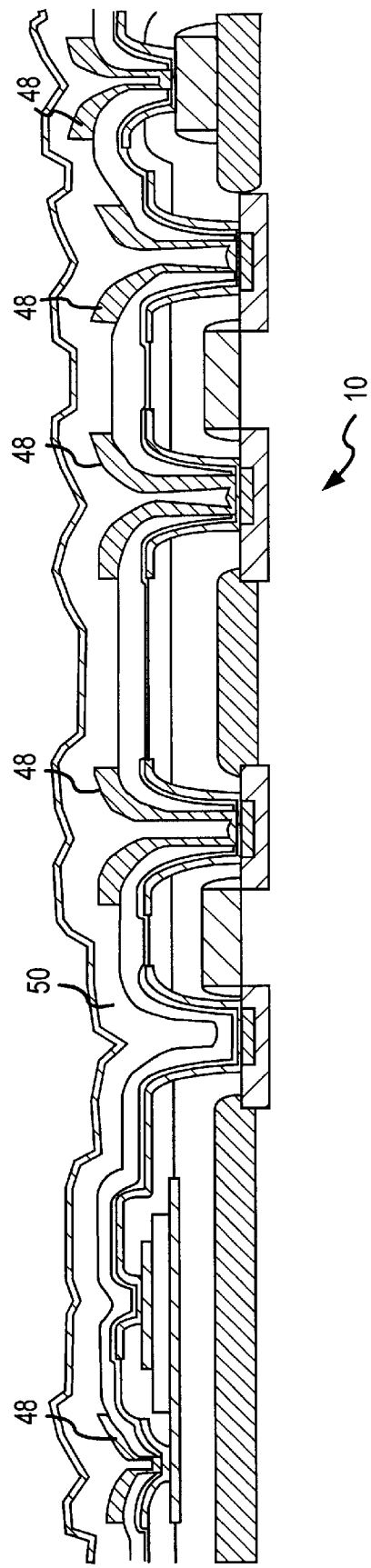

In FIG. 9, a passivation layer 50 is deposited to a thickness of between about 5,000 to 10,000 Angstroms thick or other thicknesses as desired. While conventional passivation materials such as silicon dioxide and silicon nitride can be used, ferroelectric or other exotic passivation materials can also be used.

A Barrier Layer for a High Density/Planar Process

Figure 10:
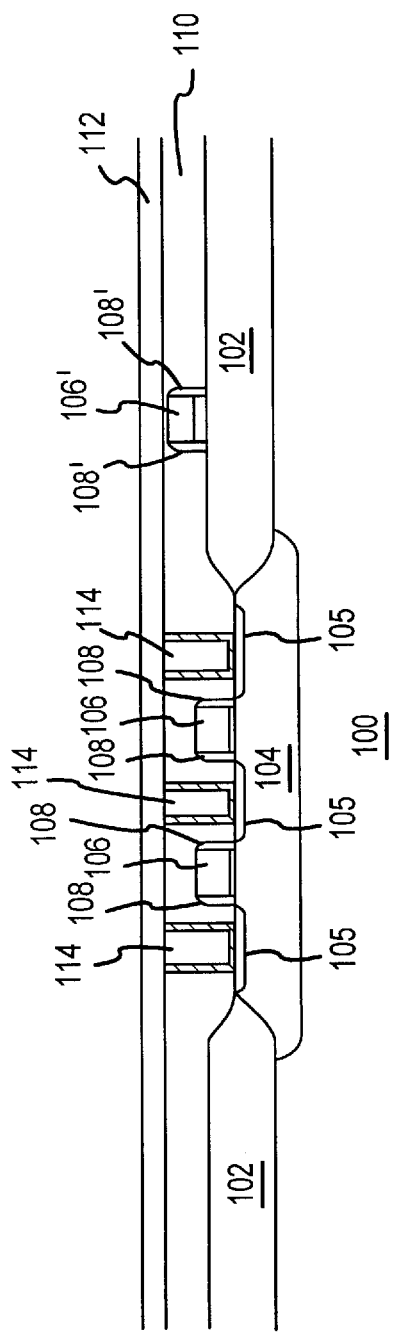

Referring now to FIG. 10, a portion of an integrated circuit CMOS underlayer is shown including a silicon or other substrate 100, a thick field oxide layer 102, and an active well 104. Active well 104 shown in FIG. 10 also includes licided contacts 105 for forming two transistors having a common source/drain. Gates 106 are formed on the top of the active well 104 and include a polysilicon gate portion and a thin gate oxide layer. Gates 106 are bordered by two oxide sidewalls 108. A gate 106' and sidewalls 108' are formed on the thick field oxide 102. Gate 106' represents the portion of the gate that is eventually contacted and may actually be orthogonal to the direction of gates 106. A first dielectric oxide layer 110 is formed over gates 106 and 106' to a sufficient thickness (at least 1000 to 3000 Angstroms thick beyond the surface of the highest gate feature) so that a planarized oxide layer can be formed.

Contacts to the active area 104 are patterned and etched through dielectric layer 110, and cleaned. These contacts to the active area 104 are filled with conducting plugs 114. The conducting plugs are formed with a thin Ti/TiN liner layer and then filled with CVD tungsten.

The wafer is then coated with a second planarized dielectric oxide layer 112 that is of sufficient thickness (about 1500 to 3000 Angstroms thick) to protect the tungsten plugs 114 from subsequent processing steps.

Figure 11:
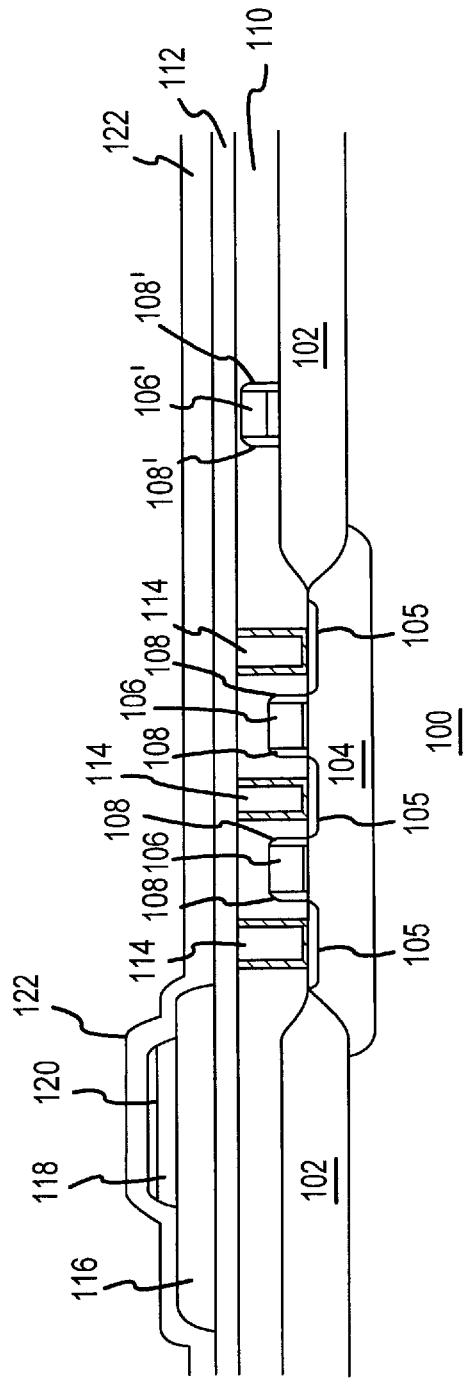

Referring now to FIG. 11, a capacitor stack is formed on the surface of the second planarized dielectric layer 112. A platinum or other suitable material bottom electrode layer 116 is deposited. Since the bottom electrode layer 116 is formed on planarized dielectric layer 112, it can be made thinner than previously described, down to a thickness of about 1000 Angstroms. A ferroelectric layer 118 is then deposited and annealed. A platinum or other suitable material top electrode layer 120 is subsequently deposited. The top electrode layer 120 is then patterned, etched, and cleaned to form the top electrode of the ferroelectric capacitor stack. The ferroelectric layer 118 is then annealed for a second time, and is then patterned, etched, and cleaned. The bottom electrode layer 116 is subsequently patterned, etched and cleaned. The patterned ferroelectric layer 118 then receives a third anneal.

After the ferroelectric capacitor stack is formed, an FEO (ferroelectric oxide) layer 122 is deposited over the entire surface of the integrated circuit.

Figure 12:
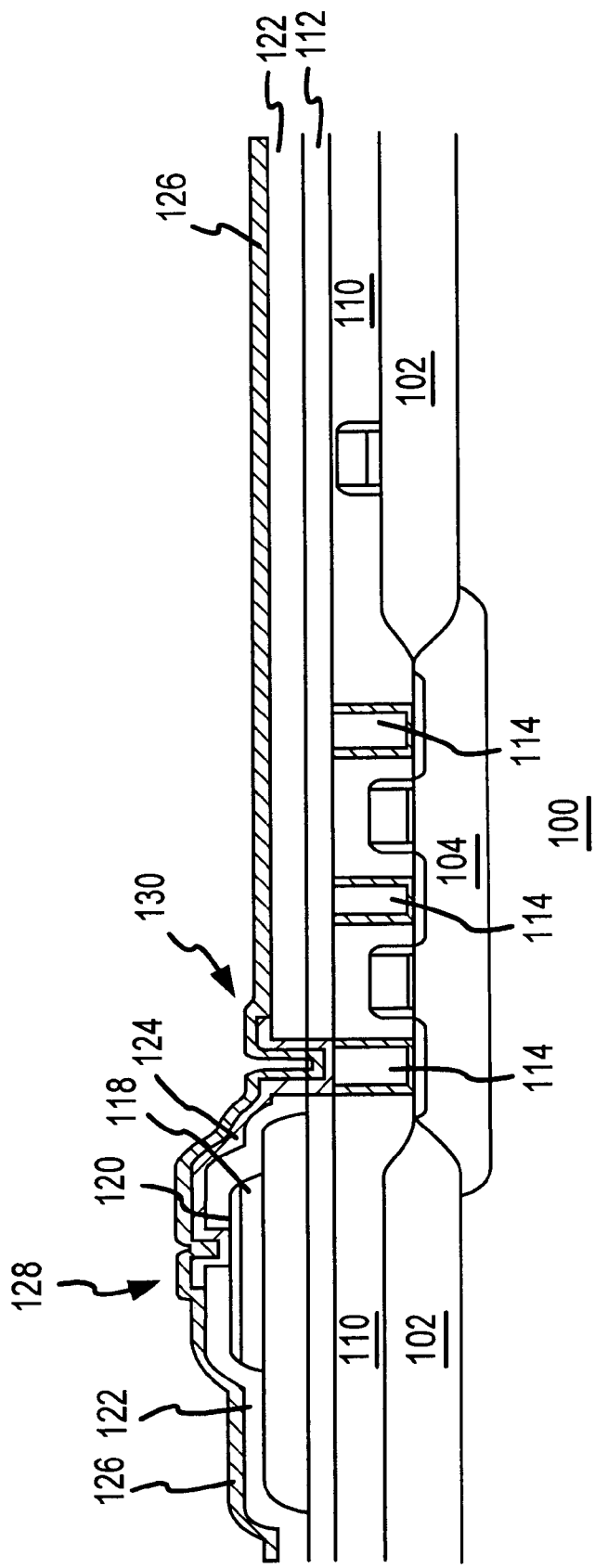

Referring now to FIG. 12, a contact 128 to the top electrode 120 is patterned, etched through FEO layer 122, and cleaned. The ferroelectric layer 118 can receive an additional anneal at this point in the process, if desired. A contact 130 to the active area tungsten plug 114 is patterned, etched through FEO layer 122 and the second dielectric layer 112, and cleaned. A TiN local interconnect layer 124 is deposited to form a conductive path from the top electrode 120 to the active area 104. The local interconnect layer 124 is patterned, etched, and cleaned. A continuous barrier layer 126 is then deposited having the same properties, characteristics, and thicknesses as previously described.

Figure 13:
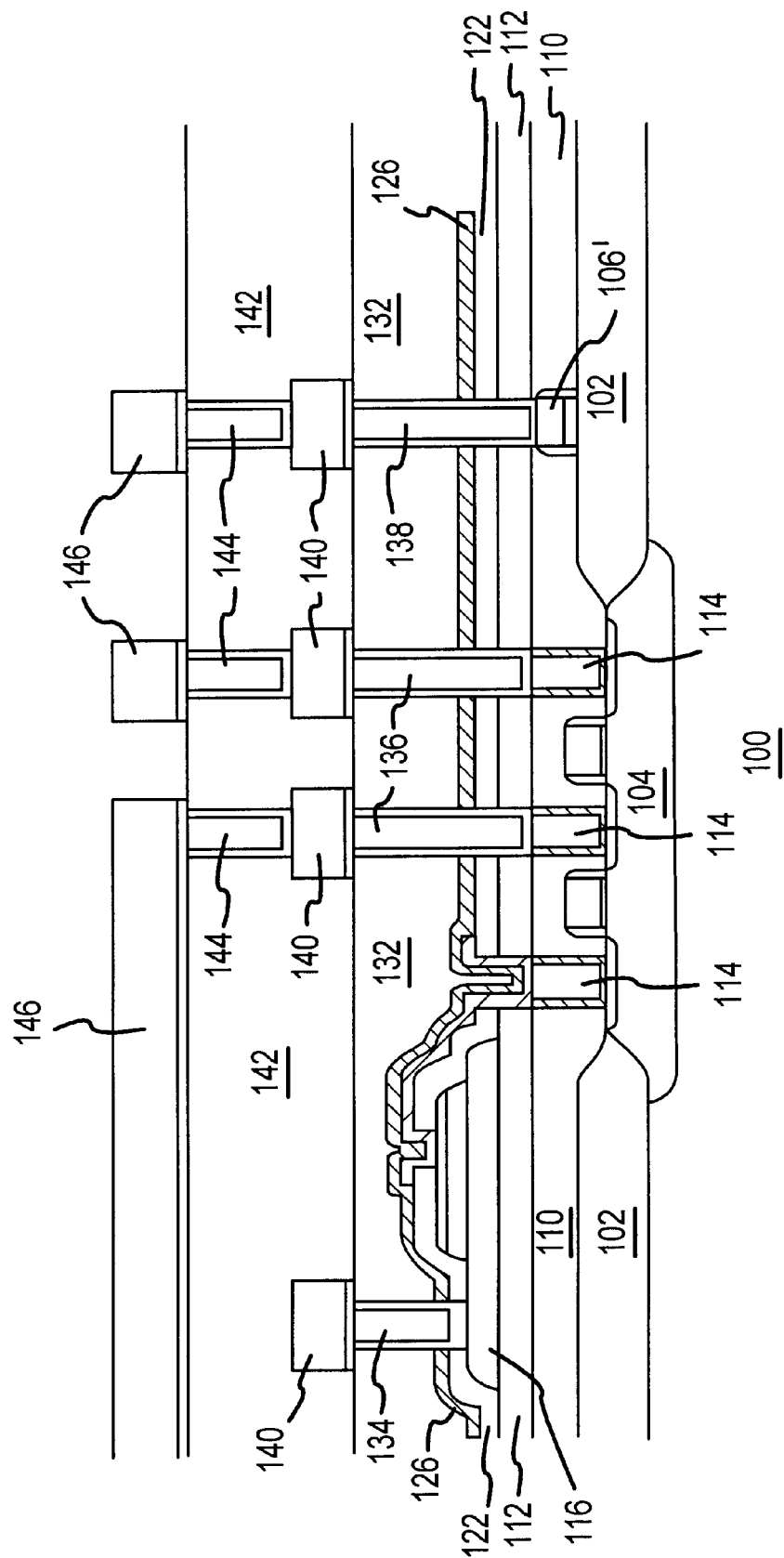

Referring now to FIG. 13, a first inter-layer dielectric layer 132 (ILD1) is deposited and planarized. Planarized dielectric layer 132 should be about 3000 to 5000 Angstroms thick, or a thickness sufficient to cover the topology of the ferroelectric capacitor stack. Contacts to the bottom electrode 116, polysilicon gate 106', and active area tungsten plugs 114 are patterned, etched through some or all of layers 132, 126, 122, and 112, and cleaned. These contacts are filled with Ti/TiN and tungsten as previously described to form tungsten plugs 134, 138, and 136. A first metal layer 140, typically formed of a Ti, TiN, or Ti/TiN layer in combination with an aluminum and copper alloy layer is deposited on the surface of ILD layer 132. First metal layer 140 is then patterned, etched, and cleaned to form metalization for the bottom electrode 116, polysilicon gate 106', and active area 104.

If required, an additional metal interconnect layer, or subsequent metal layers can be added.

Continuing with FIG. 13, a second interlevel dielectric layer 142 (ILD2) is deposited and planarized. Layer 142 is about 8000 Angstroms thick, or as thick as required to fully cover the first metal layer 140. Contacts to the first metal layer 140 are etched through layers 142, and cleaned. These contacts are filled with Ti/TiN and tungsten as previously described to form tungsten plugs 144. A second metal layer 146, typically formed of a Ti, TiN, or Ti/TiN layer in combination with an aluminum and copper alloy layer is deposited on the surface of ILD layer 142. Second metal layer 146 is then patterned, etched, and cleaned.

Finally, the circuit can be passivated as shown in FIG. 9 and as previously described.

Having described and illustrated the principle of the invention in a preferred embodiment thereof, it is appreciated by those having skill in the art that the invention can be modified in arrangement and detail without departing from such principles. I therefore claim all modifications and variations coming within the spirit and scope of the following claims.

I claim:

1. A method of forming a barrier layer in a ferroelectric memory including top and bottom ferroelectric capacitor electrodes, and first and second source/drain transistor contacts, the method comprising:
   forming a first oxide layer over a top surface of the ferroelectric memory;
   forming contacts though the first oxide layer to the top and bottom electrodes, and first and second source/drain contacts;
   forming and patterning a local interconnect metal layer on the bottom electrode and second source/drain contact, and between the top electrode and the first source/drain contact;
   forming a continuous barrier layer directly over the local interconnect metal layer;
   forming a second oxide layer over the continuous barrier layer; and
   forming contacts through the second oxide layer and barrier layer to the bottom electrode and second source/drain.

2. The method of claim 1 in which forming the first oxide layer comprises depositing a layer of oxide about 3000 Angstroms thick.

3. The method of claim 1 in which forming contacts through the first oxide layer comprises dry anisotropic etching of the top and bottom electrode contacts, and dry isotropic etching of the first and second source/drain contacts.

4. The method of claim 1 in which forming a local interconnect metal layer comprises forming a layer of TiN between about 500 and 1500 Angstroms thick.

5. The method of claim 1 in which patterning a local interconnect layer comprises reactive ion etching the local interconnect layer.

6. The method of claim 1 in which forming the barrier layer comprises forming a layer of silicon nitride between about 200 and 1200 Angstroms thick.

7. The method of claim 1 in which forming the barrier layer comprises forming a layer of aluminum oxide between about 500 and 1000 Angstroms thick.

8. The method of claim 1 in which forming the barrier layer comprises forming a layer of titanium oxide between about 200 and 1200 Angstroms thick.

9. The method of claim 1 in which forming the barrier layer comprises forming a layer of PZT between about 200 and 1200 Angstroms thick.

10. The method of claim 1 in which forming the barrier layer comprises forming a layer of PLZT between about 200 and 1200 Angstroms thick.

11. The method of claim 1 in which forming the barrier layer comprises forming a layer of SBT between about 200 and 1200 Angstroms thick.

12. The method of claim 1 in which forming the barrier layer comprises forming a layer of BST between about 200 and 1200 Angstroms thick.

13. The method of claim 1 in which forming the barrier layer comprises forming a layer of high density silicon dioxide between about 200 and 1200 Angstroms thick.

14. The method of claim 1 in which forming the barrier layer comprises forming a layer of a hydrogen-absorbent material of sufficient thickness to substantially block the flow of hydrogen to the ferroelectric memory.

15. The method of claim 1 in which forming the second oxide layer comprises forming an oxide layer about 3500 Angstroms thick.

16. The method of claim 1 in which forming contacts through the second oxide layer comprises:
   dry anisotropic etching of the second oxide layer such that the barrier layer forms an etch stop; and
   high density plasma etching or ion milling the barrier layer, using the etched second oxide layer as a hard mask.

17. The method of claim 1 further comprising metalizing the bottom electrode and second source/drain contact.

18. The method of claim 17 further comprising passivating the upper surface of the ferroelectric memory.

19. A method of forming a barrier layer for a ferroelectric memory including a ferroelectric capacitor and a transistor and having a local interconnect layer, the method comprising:
   forming a continuous hydrogen-absorbent barrier layer directly over the local interconnect layer having a sufficient thickness to substantially block the flow of hydrogen to the ferroelectric memory;
   forming an oxide layer over the barrier layer;
   selectively etching the oxide layer down to the barrier layer; and
   using the etched oxide layer as a hard mask to etch the barrier layer.

20. A method of forming a barrier layer in a ferroelectric memory including top and bottom ferroelectric capacitor electrodes, and first and second source/drain transistor contacts, the method comprising;
   forming a first oxide layer over a top surface of the ferroelectric memory;
   forming contacts through the first oxide layer to the top and bottom electrodes, and first and second source/drain contacts;

forming and patterning a local interconnect metal layer on the bottom electrode and second source/drain contact, and between the top electrode and the first source/drain contact;

forming a continuous barrier layer of hydrogen-absorbent material directly over the local interconnect metal layer;

forming a second oxide layer over the continuous barrier layer;

forming contacts through the second oxide layer down to an upper surface of the barrier layer over the bottom electrode and second source/drain; and subsequently forming contacts through the etched second oxide layer and barrier layer to the bottom electrode and second source/drain, such that a portion of the second oxide layer is removed.

* * * * *